(12) United States Patent
Wang et al.

(10) Patent No.: US 9,627,170 B2
(45) Date of Patent: Apr. 18, 2017

(54) ELECTRODE FOR USE IN ION IMPLANTATION APPARATUS AND ION IMPLANTATION APPARATUS

(71) Applicants: Boe Technology Group Co., Ltd., Beijing (CN); Ordos Yuansheng Optoelectronics Co., Ltd., Inner Mongolia (CN)

(72) Inventors: Zhiqiang Wang, Beijing (CN); Feng Kang, Beijing (CN); Bo Yang, Beijing (CN); Jingyi Xu, Beijing (CN)

(73) Assignees: Boe Technology Group Co., Ltd., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 14/500,160

(22) Filed: Sep. 29, 2014

(65) Prior Publication Data

US 2015/0380203 A1 Dec. 31, 2015

(30) Foreign Application Priority Data

Jun. 30, 2014 (CN) .......................... 2014 1 0307986

(51) Int. Cl.
*H01J 37/08* (2006.01)
*H01J 37/317* (2006.01)
*H01J 27/02* (2006.01)

(52) U.S. Cl.
CPC ............ *H01J 37/08* (2013.01); *H01J 27/024* (2013.01); *H01J 37/3171* (2013.01); *H01J 2237/0206* (2013.01); *H01J 2237/065* (2013.01)

(58) Field of Classification Search
USPC ..................... 250/492.1, 492.23, 396 R, 288
See application file for complete search history.

(56) References Cited

U.S. PATENT DOCUMENTS 3,999,097 A * 12/1976 Ko ..................... H01J 37/3171
219/121.21
4,013,891 A * 3/1977 Ko ..................... H01J 37/3007
250/398

(Continued)

FOREIGN PATENT DOCUMENTS

CN 101470100 7/2009
CN 102017054 4/2011

(Continued)

OTHER PUBLICATIONS

Chinese Patent Application No. 201410307986.7 dated Dec. 30, 2015.

(Continued)

*Primary Examiner* — Phillip A Johnston
(74) *Attorney, Agent, or Firm* — Calfee, Halter & Griswold LLP (57) ABSTRACT

An electrode for use in an ion implantation system includes a body portion and a penetration portion. The penetration portion includes penetration holes which are closely and regularly arranged. The penetration holes have the shape of a circle or a regular polygon with at least four sides. The electrode has an increased aperture ratio which, in turn, increases the density of the ion beam, thereby improving the efficiency of the ion implantation process.

9 Claims, 7 Drawing Sheets

(56) References Cited

U.S. PATENT DOCUMENTS

| | | | | |
|---|---|---|---|---|
| 4,898,557 A | * | 2/1990 | Engemann | H01J 9/14 |
| | | | | 445/11 |
| 6,335,535 B1 | * | 1/2002 | Miyake | H01J 37/32412 |
| | | | | 250/423 R |
| 7,421,973 B2 | * | 9/2008 | Kellerman | H01J 37/08 |
| | | | | 118/723 CB |
| 8,374,830 B2 | * | 2/2013 | Kameyama | G06F 17/50 |
| | | | | 250/396 R |
| 8,425,741 B2 | * | 4/2013 | Proudfoot | C23C 14/46 |
| | | | | 118/620 |

FOREIGN PATENT DOCUMENTS

| | | |
|---|---|---|
| CN | 102486985 | 6/2012 |
| JP | 2008053003 | 3/2008 |
| JP | 2010153278 | 7/2010 |
| KR | 20090015392 | 2/2009 |

OTHER PUBLICATIONS

Office action from Chinese Application No. 201410307986.7 dated Jun. 1, 2016.
Office Action from China Application No. 201410307986.7 dated Oct. 10, 2016.

* cited by examiner

ELECTRODE FOR USE IN ION IMPLANTATION APPARATUS AND ION IMPLANTATION APPARATUS

RELATED APPLICATIONS

The present application claims the benefit of Chinese Patent Application No. 201410307986.7, filed Jun. 30, 2014, the entire disclosure of which is incorporated herein by reference.

FIELD

The present disclosure relates to the field of semiconductor technology, and particularly to an electrode for use in an ion implantation apparatus and an ion implantation apparatus.

BACKGROUND

In the field of semiconductor technology, the ion implantation technique generally refers to a technique for performing ion doping on a region near the surface of a semiconductor material. The primary aim of the ion implantation technique is to change the carrier concentration or conduction type of the semiconductor material. The ion implantation apparatus has been widely applied to an ion doping process. Due to its ability to satisfy needs for a shallow junction, low temperature, and accurate control, the ion implantation apparatus has become a key apparatus in the semiconductor fabricating process.

In the ion implantation process, the ion beam generated by an ion source has to go through a plurality of electrodes with a certain aperture ratio to accelerate the ions. The aperture ratio of an electrode refers to a ratio between an area of penetration portions in the electrode and the total area of the electrode. As can be seen, the aperture ratio of the electrode not only determines the utilization efficiency of doped ions, but also affects the density of the ion beam. Accordingly, there is a need for increasing the aperture ratio of electrodes to improve ion implantation efficiency.

SUMMARY

The present disclosure provides an electrode for use in an ion implantation apparatus and an ion implantation apparatus, which avoid or alleviate one or more drawbacks of, or otherwise provide improvements on, a conventional ion implantation apparatus and/or an electrode for use therein. For example, according to the present disclosure, the aperture ratio of an electrode in the ion implantation apparatus can be increased, which increases the density of the ion beam and thus improves the efficiency of ion implantation process.

In one exemplary aspect of the present disclosure, there is provided an electrode for use in an ion implantation apparatus, the electrode comprising a body portion and a penetration portion; wherein the penetration portion comprises a plurality of penetration holes which are closely and regularly arranged, and wherein the penetration holes have the shape of a circle or a regular polygon with at least four sides.

For example, the penetration holes can have the shape of a circle. The plurality of penetration holes can be uniformly arranged in the penetration portion of the electrode, and the distances between the centers of any two neighboring penetration holes are equal to each other.

For example, the penetration holes can have the shape of a regular hexagon. The penetration holes can be arranged in a honeycomb pattern.

In another exemplary aspect of the present disclosure, there is provided an ion implantation apparatus, the ion implantation apparatus comprising an ion source system, an ion extracting system, and a mass spectrum analyzer, wherein the above-mentioned electrode is used as an electrode in the ion extracting system.

The electrode in the ion extracting system can comprise an accelerating electrode near the ion source system and a ground electrode near the mass spectrum analyzer. An electric field in a direction from the accelerating electrode to the ground electrode is formed between the accelerating electrode and the ground electrode, and the electric field is used to accelerate and extract an ion beam generated by the ion source system.

The electrode in the ion extracting system can further comprise an extracting electrode between the accelerating electrode and the ground electrode, wherein the voltage applied to the accelerating electrode is higher than the voltage applied to the extracting electrode, and wherein the voltage applied to the extracting electrode is higher than the voltage applied to the ground electrode.

The electrode in the ion extracting system can further comprise a decelerating electrode between the extracting electrode and the ground electrode, wherein the voltage applied to the ground electrode is higher than the voltage applied to the decelerating electrode, and wherein the intensity of the electric field between the extracting electrode and the ground electrode is lower than the intensity of the electric field between the ground electrode and the decelerating electrode.

Penetration holes of the accelerating electrode, penetration holes of the extracting electrode, penetration holes of the decelerating electrode, and penetration holes of the ground electrode can have the same shape and size. Additionally, penetration holes of the accelerating electrode, penetration holes of the extracting electrode, penetration holes of the decelerating electrode, and penetration holes of the ground electrode can have centers that are aligned with one another (i.e., in the same straight line).

The ion source system can comprise an ion source and a positive electrode, wherein the ion source is a plasma ion source for generating plasma, and wherein the positive electrode is used to drive cations in the plasma to move in a direction towards the ion extracting system.

As noted above, the present disclosure provides an electrode for use in an ion implantation apparatus and an ion implantation apparatus. The electrode for use in an ion implantation apparatus comprises a body portion and a penetration portion, wherein the penetration portion comprises a plurality of penetration holes which are closely and regularly arranged, and wherein the penetration holes have the shape of a circle or a regular polygon with at least four sides.

As a result, by providing the plurality of penetration holes in the penetration portion of the electrode which are closely and regularly arranged, and by arranging the plurality of penetration holes in a specific pattern according to their actual shape, it is possible to effectively increase the aperture ratio of the electrode. In case the electrode is applied to an ion implantation apparatus, the probability for ions in the ion beam to pass through the electrode will be improved, so that the density of the ion beam can be increased, and the efficiency of the ion implantation process can be further improved.

BRIEF DESCRIPTION OF THE DRAWINGS

Several technical aspects of the present disclosure will be described in more detail below with reference to the accompanying drawings in order for those skilled in the art to be able to carry out the present disclosure. The present disclosure may, however, be embodied in many different forms and should not be construed as limited to the exemplary embodiments set forth herein. In particular, the general inventive concepts are not intended to be limited by the various illustrative embodiments disclosed herein.

DETAILED DESCRIPTION

The present invention and associated general inventive concepts will be further described hereinafter in detail with reference to the accompanying drawings and various exemplary embodiments. One of ordinary skill in the art will appreciate that these exemplary embodiments only constitute some of the possible embodiments encompassed by the present invention and associated general inventive concepts. As such, the scope of the present disclosure is by no means limited to the exemplary embodiments set forth herein.

The reference numerals presented in the drawings are explained as follow: 10 ion source system; 20 ion extracting system; 30 mass spectrum analyzer; 200 electrode; 200a body portion; 200b penetration portion; 201 accelerating electrode; 202 ground electrode; 203 extracting electrode; and 204 decelerating electrode.

Figure 1:
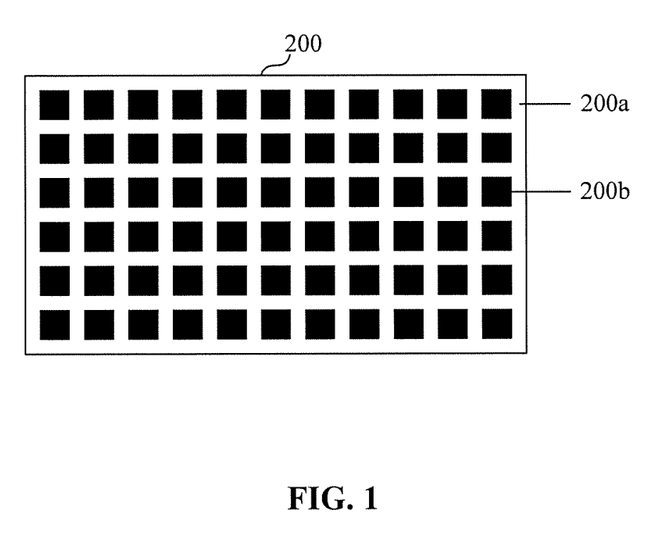
FIG. 1 is a schematic diagram illustrating an electrode, according to an exemplary embodiment.
Figure 2:
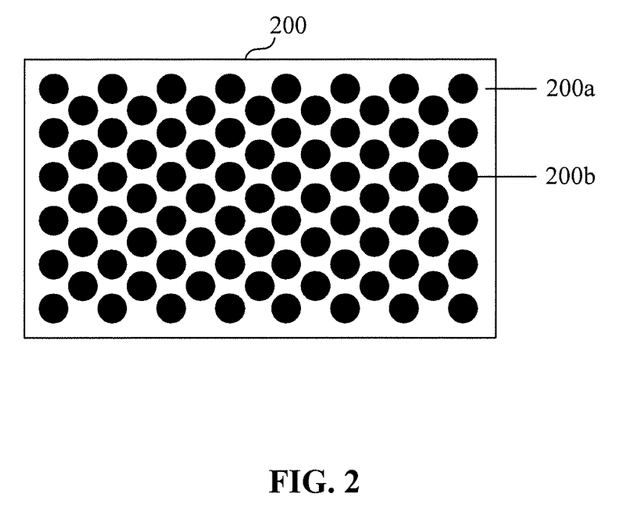
FIG. 2 is a schematic diagram illustrating an electrode, according to another exemplary embodiment.
Figure 3:
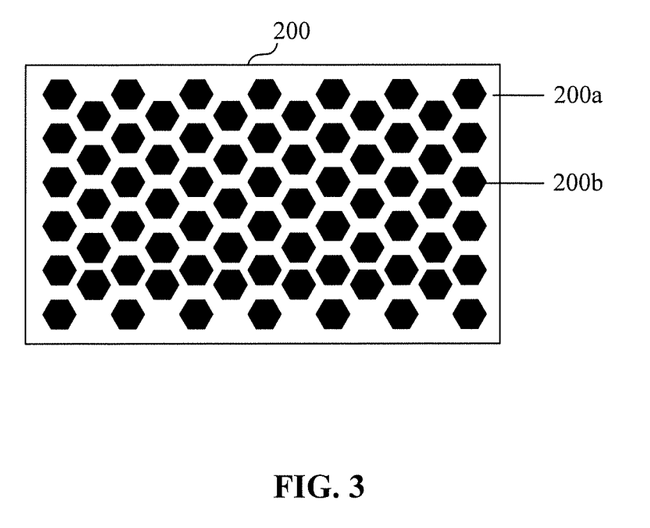
FIG. 3 is a schematic diagram illustrating an electrode, according to yet another exemplary embodiment.

The present disclosure provides an electrode for use in an ion implantation apparatus. As shown in FIGS. 1-3, the electrode 200 can comprise a body portion 200a and a penetration portion 200b. The penetration portion 200b can comprise a plurality of penetration holes which are closely and regularly arranged, and the penetration holes can have the shape of a circle or a regular polygon. Here, the regular polygon has at least four sides.

Firstly, it is noted that the electrode 200 comprises the body portion 200a and the penetration portion 200b. The body portion 200a can act as a support region for the electrode 200, and the penetration portion 200b can act as a penetration region for ions.

Secondly, the aperture ratio of the electrode 200 refers to the ratio of the area of the penetration portion 200b to the total area of the electrode 200. In order to ensure the electrode 200 has a large aperture ratio, the plurality of penetration holes can be arranged closely and regularly in the penetration portion 200b of the electrode 200. The manner in which the plurality of penetration holes are arranged in the penetration portion 200b of the electrode 200 can be designed according to the actual shape of the penetration holes. The present disclosure is not limited in this aspect, and the purpose is to obtain a large aperture ratio.

Thirdly, the electrode 200 is primarily applied to an ion implantation apparatus. In the ion implantation process, not only should the aperture ratio of the electrode be considered, but the electrical stability (e.g., point discharge) and mechanical stability (e.g., deformation or fracture) of the electrode should also be considered. Therefore, the penetration holes can have the shape of a circle or a regular polygon (e.g., a regular polygon with four or more sides).

As noted above, the present disclosure provides an electrode for use in an ion implantation apparatus. The electrode 200 can comprise the body portion 200a and the penetration portion 200b. The penetration portion 200b can comprise a plurality of penetration holes which are closely and regularly arranged, and the penetration holes have the shape of a circle or a regular polygon. Here, the regular polygon has at least four sides.

By providing the plurality of penetration holes in the penetration portion 200b of the electrode 200, and by closely and regularly arranging the plurality of penetration holes in a specific pattern according to their actual shape, it is possible to effectively increase the aperture ratio of the electrode 200. During operation of the ion implantation apparatus including the electrode 200, the probability for ions in the ion beam to pass through the electrode 200 will be improved, so that the density of the ion beam can be increased, and the efficiency of an ion implantation process can be further improved.

In one exemplary embodiment, the penetration holes can be square penetration holes, and a plurality of the square penetration holes can be arranged in a matrix as shown in FIG. 1. In another exemplary embodiment, the penetration holes can be circular penetration holes, and a plurality of the circular penetration holes can be arranged at an equal interval or otherwise in an ordered fashion as shown in FIG. 2. In yet another exemplary embodiment, the penetration holes can be regular hexagon penetration holes, and a plurality of the regular hexagon penetration holes can be arranged in a honeycomb pattern as shown in FIG. 3.

With respect to each of the exemplary electrodes 200 described above, while the aperture ratio of the electrode 200 may be increased, it is further required to decrease the probability of a point discharge at the electrode 200. In this context, the point discharge refers to the phenomenon of corona discharge at a sharp portion of an object under a strong electric field. The sharper the sharp portion of the object, the higher the probability that a point discharge occurs.

As a result, if the penetration holes have evident corner portions, such as in the case of square penetration holes, the electrode 200 will contain protruding sharp portions, which may introduce severe point discharge.

Accordingly, in certain preferred embodiments, the penetration holes can have the shape of a circle or a regular hexagon. As compared with square penetration holes, a point discharge does is much less likely to occur in the electrode 200 with circular or regular hexagonal penetration holes. Therefore, if the electrode 200 comprises circular or regular hexagonal penetration holes, the electrode 200 can have a relatively large aperture ratio while also having a decreased likelihood of experiencing a point discharge.

Figure 4:
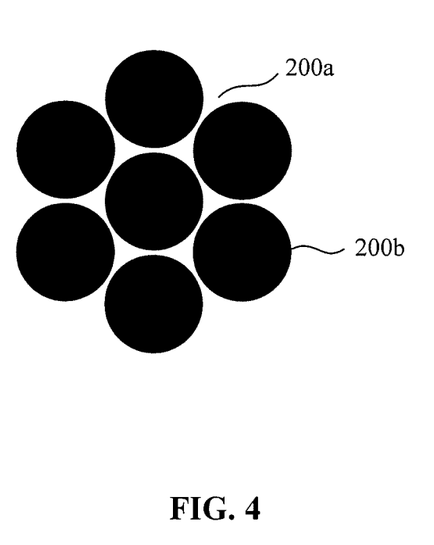
FIG. 4 is a schematic view illustrating the arrangement of penetration holes in the electrode of FIG. 2.

If the penetration holes have the shape of a circle, as shown in FIGS. 2 and 4, the plurality of penetration holes can be uniformly distributed in the penetration portion 200b of the electrode 200, such that the distances between the centers of any two neighboring penetration holes are equal to each other.

Figure 5:
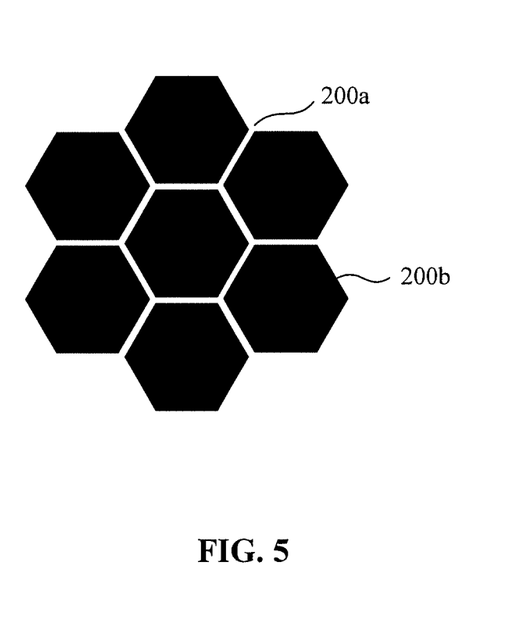
FIG. 5 is a schematic view illustrating the arrangement of penetration holes in the electrode of FIG. 3.

If the penetration holes have the shape of a regular hexagon, as shown in FIGS. 3 and 5, the plurality of penetration holes can be arranged in a honeycomb pattern.

Comparison can be made between the arrangement of the circular penetration holes in FIG. 2 and the arrangement of the regular hexagon penetration holes in FIG. 3, with a unit of each shape being enlarged in FIGS. 4 and 5, respectively. It can be seen in FIGS. 4 and 5 that if the penetration holes have the shape of a regular hexagon and are arranged in a honeycomb pattern, a relatively larger aperture ratio can be obtained. The reason lies in that the honeycomb pattern has a very high specific surface area. If the area of the electrode 200 is constant, and penetration holes are arranged in the honeycomb pattern, the electrode 200 can have or otherwise approach a maximum aperture ratio. In certain preferred embodiments, the penetration holes have the shape of a regular hexagon and are arranged in the honeycomb pattern.

In this manner, the increase in aperture ratio of the electrode 200 can increase the probability for ions in the ion beam to pass through the electrode 200, thus increasing the density of the ion beam which, in turn, further improves the efficiency of the ion implantation process. Furthermore, the penetration holes having the shape of a regular hexagon can effectively reduce the probability of point discharge. Furthermore, the penetration holes arranged in the honeycomb pattern provide improved mechanical stability, such that the electrode 200 does not tend to deform or break down which, in turn, further facilitates improved electrical stability of the electrode 200.

Figure 6:
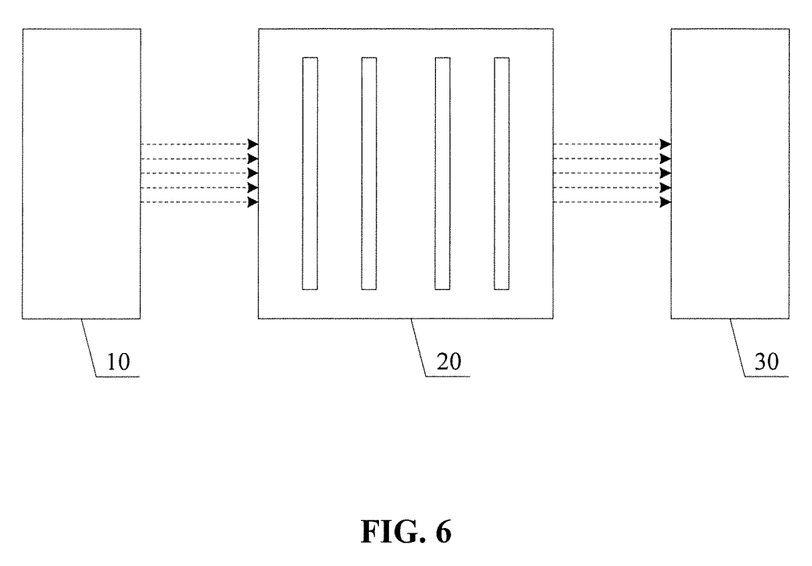
FIG. 6 is a schematic diagram illustrating an ion implantation apparatus, according to an exemplary embodiment.

The present disclosure also provides an ion implantation apparatus. As shown in FIG. 6, the ion implantation apparatus comprises an ion source system 10, an ion extracting system 20, and a mass spectrum analyzer 30. The above-mentioned electrode 200 can be used as an electrode in the ion extracting system 20.

The ion source system 10 can be used to generate an ion beam, and drive the generated ion beam to move towards the ion extracting system 20. The ion extracting system 20 can be used to accelerate and extract cations (e.g., boron ions $B^{3+}$, phosphorous ions $P^{5+}$) in the ion beam generated by the ion source system 10. The mass spectrum analyzer 30 can be used to screen ions with specific charge-to-mass ratio for use in subsequent ion implantation.

It is noted that the ion extracting system 20 can comprise a plurality of electrodes, and each of these electrodes can adopt the structure and features of the electrode 200 described above. It is also possible that only some of these electrodes adopt the structure and features of the electrode 200. In an exemplary embodiment, in order to obtain or otherwise approach the maximum density of the ion beam, each electrode in the ion extracting system 20 adopts the structure and features of the electrode 200.

Figure 7:
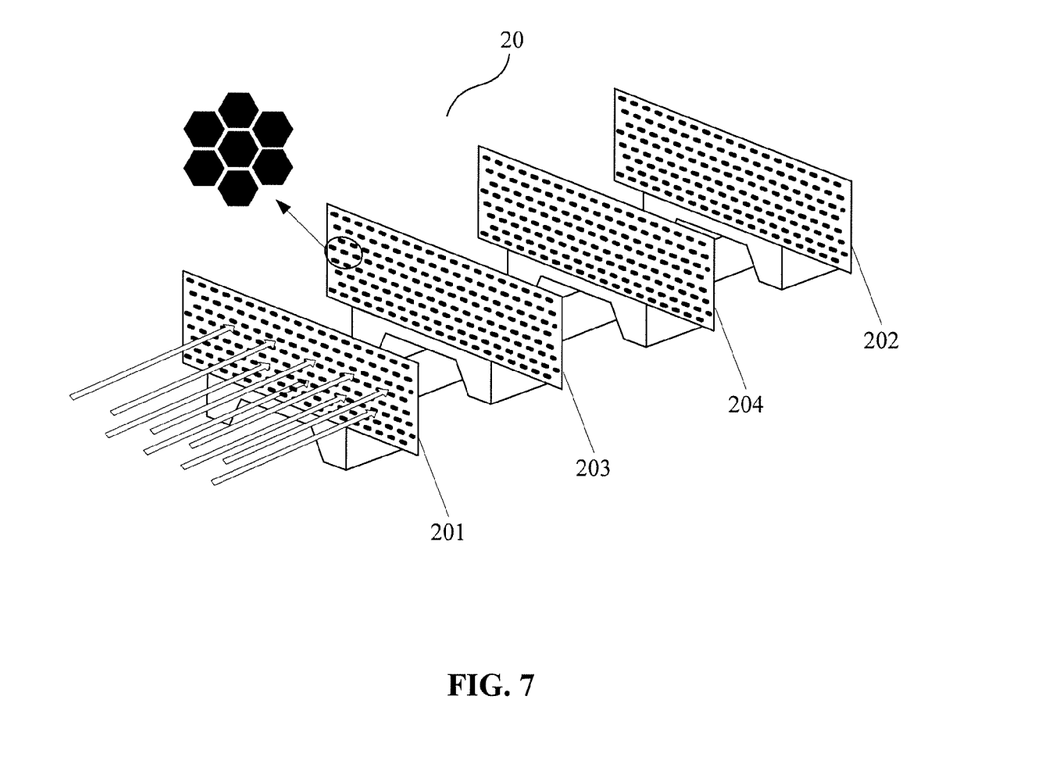
FIG. 7 is a schematic diagram illustrating an ion extracting system, according to an exemplary embodiment.

As shown in FIG. 7, the electrodes in the ion extracting system 20, according to an exemplary embodiment, comprise an accelerating electrode 201 nearest the ion source system 10 and a ground electrode 202 nearest the mass spectrum analyzer 30. An electric field in a direction from the accelerating electrode 201 to the ground electrode 202 is formed between the accelerating electrode 201 and ground electrode 202, and this electric field is used to accelerate and extract the ion beam generated by the ion source system 10.

In this manner, under the effect of the electric field between the accelerating electrode 201 and the ground electrode 202, cations in the ion beam are subject to an accelerating process, and energy (speed) of the ions increases significantly with the running duration.

As shown in FIG. 7, the electrodes in the ion extracting system 20 further comprise an extracting electrode 203 between the accelerating electrode 201 and the ground electrode 202. The voltage applied to the accelerating electrode 201 is higher than the voltage applied to the extracting electrode 203, and the voltage applied to the extracting electrode 203 is higher than the voltage applied to the ground electrode 202.

The extracting electrode 203 is used to adjust distribution of the electric field between the accelerating electrode 201 and the ground electrode 202, thus adjusting the speed, quantity, and focusing level of the ions.

By way of example, a specific high voltage is applied to the accelerating electrode 201, and a zero voltage is applied to the ground electrode 202. In this case, a high voltage electric field in a direction from the accelerating electrode 201 to the ground electrode 202 can be formed between the accelerating electrode 201 and the ground electrode 202. When the ion beam generated by the ion source system 10 runs between the accelerating electrode 201 and the ground electrode 202, the ion beam will be accelerated towards the ground electrode 202 under the effect of the electric field. By applying a forward voltage lower than the above specific high voltage to the extracting electrode 203 between the accelerating electrode 201 and the ground electrode 202, it is possible to divide the electric field into two electric fields, i.e., an electric field between the accelerating electrode 201 and the extracting electrode 203 and an electric field between the extracting electrode 203 and the ground electrode 202. These two electric fields have the same direction (i.e., the direction of the electric field between the accelerating electrode 201 and the ground electrode 202.) Because the magnitude of the voltage applied to the extracting electrode 203 can be controlled as needed, the distribution of the electric field between the accelerating electrode 201 and the ground electrode 202 can be adjusted while the direction of the electric field is maintained, so that the speed, quantity, and focusing level of the ion beam can be controlled as needed.

As shown in FIG. 7, the electrode in the ion extracting system 20 can further comprise a decelerating electrode 204 between the extracting electrode 203 and the ground electrode 202. The voltage applied to the ground electrode 202 can be higher than the voltage applied to the decelerating electrode 204, and the intensity of the electric field between the extracting electrode 203 and the ground electrode 202 is lower than the intensity of electric field between the ground electrode 202 and the decelerating electrode 204.

An electric field in a direction from the ground electrode 202 to the decelerating electrode 204 can be formed between the decelerating electrode 204 and the ground electrode 202. The direction of this electric field is reverse to that of each electric field as described above, and thus can be referred to as a reverse electric field. The reverse electric field between the decelerating electrode 204 and the ground electrode 202 can be used to block secondary electrons (which are generated during the ion beam impacting the ground electrode 202) from moving towards the ion source system 10.

Particularly, all of the accelerating electrode 201, the extracting electrode 203, the decelerating electrode 204, and the ground electrode 202 can comprise the body portion 200a and the penetration portion 200b. As the ion beam moves towards the ground electrode 202 under the effect of the electric field between the accelerating electrode 201 and the ground electrode 202, a portion of ions can be extracted through the penetration portion 200b of the electrode and accelerated, and another portion of ions impinge onto the body portion 200a of the electrode and thus are blocked. Only when the impinged ions are scattered again to the penetration portion 200b of the electrode, can they be extracted and accelerated. However, this portion of ions suffer from energy loss during impinging onto the electrode, and their speed is somewhat reduced when they subsequently pass through the penetration portion 200b of the electrode. In this case, after these ions enter the mass spectrum analyzer 30, they will be eliminated, thus reducing the density of the ion beam.

Meanwhile, upon arriving at the ground electrode 202, cations in the ion beam which have been extracted and accelerated without impinging have very high speed and energy. Therefore, when these cations impinge the body portion of the ground electrode 202, secondary electrons will be generated. The secondary electrons have a polarity opposite to that of ions in the ion beam, and move in a direction reverse to the ion beam under the effect of the electric field between the accelerating electrode 201 and the ground electrode 202. In the event that these secondary electrons move back towards the ion source system 10 and thus bombard the hot filament, X-rays will be generated, which poses a serious hazard to the health of the operation staff.

By arranging the decelerating electrode 204 between the extracting electrode 203 and the ground electrode 202, a reverse electric field can be formed between the decelerating electrode 204 and the ground electrode 202. Thus, secondary electrons are moved outside the ground electrode 202 under the effect of the reverse electric field, and it is possible to effectively prevent secondary electrons from bombarding the hot filament. Furthermore, in the case that the electrode in the ion extracting system 20 is provided as an electrode in which regular hexagonal penetration holes are arranged in a honeycomb pattern, the chance for secondary electrons to be generated will also be greatly reduced.

Here, the intensity of electric field between the extracting electrode 203 and the ground electrode 202 is lower than the intensity of electric field between the ground electrode 202 and the decelerating electrode 204. For the purpose of not affecting the moving direction of cations in the ion beam generated by the ion source system 10, it will be apparent to one skilled in the art that the effect of the reverse electric field on the moving speed and direction of the cations can be ignored, if the distance between the ground electrode 202 and the decelerating electrode 204 is chosen to be small.

It is noted that FIG. 7 only illustrates the positional relationship among the electrodes in the ion extracting system 20, and does not define the specific construction of the respective electrodes. Namely, the body portion and the penetration portion for the respective electrodes in the ion extracting system 20 are not limited to the shape shown in FIG. 7, and the respective electrodes can have any suitable construction, for example, the construction shown in FIGS. 1-3.

In view of the above, in an exemplary embodiment, a positive voltage is applied to both the accelerating electrode 201 and the extracting electrode 203, a zero voltage is applied to the ground electrode 202, and a negative voltage is applied to the decelerating electrode 204.

It will be apparent to one skilled in the art that the manner for applying voltage is not limited to what has been described above. Any manner is suitable, so long as it forms, between the accelerating electrode 201 and the ground electrode 202, an electric field in a direction from the accelerating electrode 201 to the ground electrode 202, adjusts the distribution of the electric field by means of the extracting electrode 203, and forms, between the ground electrode 202 and the decelerating electrode 204, an electric field in a direction from the ground electrode 202 to the decelerating electrode 204.

In the present disclosure, all electrodes in the ion extracting system 20 can adopt the above-mentioned electrode, i.e., the electrode 200 comprising the body portion 200a and the penetration portion 200b, wherein the penetration portion 200b comprises a plurality of penetration holes which are closely and regularly arranged, the penetration holes having the shape of a circle or a regular polygon and can be a circle or a regular hexagon.

In this manner, by adopting the above-mentioned electrode as all electrodes in the ion extracting system 20, not only do the respective electrodes have a relatively large aperture ratio, the probability for ions in the ion beam to pass through the respective electrodes in the ion extracting system 20 is also increased, thus improving the density of the ion beam. The penetration holes of the extracting electrode 203 and the penetration holes of the decelerating electrode 204 can have the same shape/size and corresponding positional relationship with respect to the penetration holes of the accelerating electrode 201 and the penetration holes of the ground electrode 202.

Accordingly, by adopting the same construction for the accelerating electrode 201, the ground electrode 202, the extracting electrode 203, and the decelerating electrode 204, and making the penetration holes of the respective electrodes correspond to each other in position, it is possible to effectively increase the probability for the ion beam to pass through the respective electrodes in the ion extracting system 20, thereby improving the density of the ion beam and forming a relatively large current beam. Furthermore, this can effectively save the time for ion implantation, and thus can improve overall production efficiency. For example, the penetration holes of the accelerating electrode 201, the penetration holes of the extracting electrode 203, the penetration holes of the decelerating electrode 204, and the penetration holes of the ground electrode 202 can have the same shape and size, and the penetration holes of the accelerating electrode 201, the penetration holes of the extracting electrode 203, the penetration holes of the decelerating electrode 204, and the penetration holes of the ground electrode 202 can have centers that are aligned with each other (i.e., in the same straight line).

The ion source system 10 can comprise an ion source and a positive electrode (not shown). The ion source can be a plasma ion source for generating plasma. The positive electrode can be used to drive positive charges in the plasma to move towards the ion extracting system 20.

Plasma generated by the plasma ion source does not show any obvious discipline of movement. Under the driving of the positive electrode, cations in the plasma can perform a directional movement towards the ion extracting system 20, so as to enter the electric field between the accelerating electrode 201 and the ground electrode 202, and accelerate under the effect of the electric field.

It will be apparent to one skilled in the art that, the voltage applied to the positive electrode is necessarily higher than the voltage applied to the accelerating electrode 201, so as to form an electric field in a direction from the ion source system 10 to the ion extracting system 20, thus driving cations in the plasma to enter the ion extracting system 20 under the effect of the electric field. Namely, the ion source system 10 itself should be brought to a high potential, so that cations can smoothly enter the ion extracting system 20, thus enabling the accelerating and extracting process.

Other types of ion source may be suitable, for example, a thermal ionization ion source, a flow discharge ion source, and an electron bombardment ion source.

When the ion source is a plasma ion source, electrons can be generated by using a heating wire to bombard a reaction gas for generating the plasma. In this case, the reaction gas should comprise elements of the needed ions.

For example, in case boron ions $B^{3+}$ are needed, a heating wire can be used to introduce discharge in $BF_3$ gas for forming plasma. As another example, in case phosphorus ions $P^{5+}$ are needed, a heating wire can be used to introduce discharge in $PH_3$ gas for forming plasma.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. An ion implantation apparatus comprising:
an ion source system comprising:
an ion source; and
a positive electrode;
wherein the ion source is a plasma ion source for generating plasma;
an ion extracting system configured to accelerate and extract ions in an ion beam, comprising:
an accelerating electrode;
a decelerating electrode disposed downstream of the accelerating electrode;
a ground electrode disposed downstream of the decelerating electrode;
an extracting electrode between the accelerating electrode and the ground electrode; and
an electric field formed between the accelerating electrode and the ground electrode, the electric field being oriented in a direction from the accelerating electrode to the ground electrode;
wherein the positive electrode has a higher voltage than the voltage applied to the accelerating electrode;
wherein the electric field between the accelerating electrode and the ground electrode is used to accelerate and extract the ion beam; wherein a voltage applied to the ground electrode is higher than a voltage applied to the decelerating electrode;
wherein a voltage applied to the extracting electrode is higher than a voltage applied to the ground electrode;
wherein a voltage applied to the accelerating electrode is higher than a voltage applied to the extracting electrode;
wherein the ground electrode is arranged proximate to the decelerating electrode;
wherein an intensity of an electric field between the extracting electrode and the ground electrode is lower than an intensity of an electric field between the ground electrode and the decelerating electrode; and
wherein each of the accelerating electrode and the ground electrode comprises:
a body portion and a penetration portion, the penetration portion comprising a plurality of penetration holes which are closely and regularly arranged; and
wherein the penetration holes of the accelerating electrode have a same shape and size and a corresponding positional relationship with respect to the penetration holes of the ground electrode.

2. The ion implantation apparatus of claim 1, further comprising a mass spectrum analyzer, wherein the ion extracting system is configured to accelerate and extract ions in an ion beam generated by the ion source system and supply the ions to the mass spectrum analyzer.

3. The ion extracting system of claim 1, wherein the extracting electrode comprises:
a body portion and a penetration portion, the penetration portion comprising a plurality of penetration holes which are closely and regularly arranged; and
wherein the penetration holes of the extracting electrode have a same shape and size and a corresponding positional relationship with respect to the penetration holes of the accelerating electrode and the ground electrode.

4. The ion extracting system of claim 1, wherein the decelerating electrode comprises:
a body portion and a penetration portion, the penetration portion comprises a plurality of penetration holes which are closely and regularly arranged; and
wherein the penetration holes of the decelerating electrode have a same shape and size and a corresponding positional relationship with respect to the penetration holes of the accelerating electrode and the ground electrode, and the extracting electrode.

5. The ion extracting system of claim 4, wherein a center of the penetration holes of each of the accelerating electrode, the extracting electrode, the decelerating electrode, and the ground electrode are aligned along a straight line.

6. The ion extracting system of claim 5, wherein the penetration holes have a shape of a circle or a regular polygon with at least four sides.

7. The ion extracting system of claim 6, wherein the penetration holes have a shape of a circle, the plurality of penetration holes are uniformly arranged in the penetration portion, and the distances between the centers of any two neighboring penetration holes are equal to each other.

8. The ion extracting system of claim 6, wherein the penetration holes have a shape of regular hexagon, and the plurality of penetration holes are arranged in a honeycomb pattern.

9. The ion extracting system of claim 1, wherein voltage applied to the positive electrode causes cations in the plasma to move towards the ion extracting system.

* * * * *